United States Patent
Hansen

(10) Patent No.: US 12,389,569 B2
(45) Date of Patent: Aug. 12, 2025

(54) INJECTABLE HEAT SINK

(71) Applicant: Panasonic Automotive Systems Company of America, Division of Panasonic Corporation of North America, Peachtree City, GA (US)

(72) Inventor: Nicholas Brian Hansen, Fayetteville, GA (US)

(73) Assignee: Panasonic Automotive Systems Company of America, Division of Panasonic Corporation of North America, Peachtree City, GA (US)

( * ) Notice: Subject to any disclaimer, the term of this patent is extended or adjusted under 35 U.S.C. 154(b) by 810 days.

(21) Appl. No.: 17/489,080

(22) Filed: Sep. 29, 2021

(65) Prior Publication Data

US 2022/0104389 A1 Mar. 31, 2022

Related U.S. Application Data

(60) Provisional application No. 63/084,805, filed on Sep. 29, 2020.

(51) Int. Cl.
| | |
|---|---|
| *H05K 7/20* | (2006.01) |
| *C08J 9/12* | (2006.01) |
| *C09K 5/14* | (2006.01) |
| *F28D 21/00* | (2006.01) |
| *F28F 13/00* | (2006.01) |

(Continued)

(52) U.S. Cl.
CPC ............ *H05K 7/2039* (2013.01); *C08J 9/122* (2013.01); *C09K 5/14* (2013.01); *F28D 21/00* (2013.01); *C08J 2201/022* (2013.01); *C08J 2203/06* (2013.01); *C08J 2363/00* (2013.01); *F28F 2013/001* (2013.01); *F28F 21/02* (2013.01); *F28F 21/06* (2013.01); *F28F 2255/143* (2013.01)

(58) Field of Classification Search
CPC ... H05K 7/2039; H05K 7/20854; C08J 9/122; C08J 2201/022; C08J 2203/06; C08J 2363/00; C08J 2203/02; C08J 9/02; C09K 5/14; F28D 21/00; F28F 21/02; F28F 21/06; F28F 2013/001; F28F 2255/143
See application file for complete search history.

(56) References Cited

U.S. PATENT DOCUMENTS

| | | | | |
|---|---|---|---|---|
| 5,757,615 A | * | 5/1998 | Donahoe ................. | G06F 1/203 361/679.48 |
| 11,252,841 B1 | * | 2/2022 | Alshareef ............... | F28F 3/022 |

(Continued)

FOREIGN PATENT DOCUMENTS

AU 2001296797 A1 * 7/2002 ................ C08J 9/32

OTHER PUBLICATIONS

MG Chemicals—8329TFF—25ML Thermally Conductive Adhesive'Fast Cure Epoxy Dispenser (Year: 2016).*

(Continued)

*Primary Examiner* — Nahida Sultana
(74) *Attorney, Agent, or Firm* — Laurence S. Roach, Esq.

(57) ABSTRACT

A heat sink arrangement includes a housing associated with an electronic heat source. The housing has a cavity adjacent to the heat source. A thermally conductive, electrically insulating foam heat sink is disposed in the cavity and draws heat out of the heat source. The foam heat sink may be formed of a two-part epoxy.

20 Claims, 3 Drawing Sheets

(51) Int. Cl.
  *F28F 21/02* (2006.01)
  *F28F 21/06* (2006.01)

(56) References Cited

U.S. PATENT DOCUMENTS

2007/0091565 A1* 4/2007 Malone .............. H05K 7/20145
                                              257/E23.099
2022/0018610 A1* 1/2022 Chen ................... F28D 15/0283
2022/0030738 A1* 1/2022 Yang ................... H01L 23/3672

OTHER PUBLICATIONS

Polymer Properties Database: Polyurethanes, Polymerdatabase. com, 2015-2021, https://polymerdatabase.com/polymer%20classes/Polyurethane%20type.html.
Conductivex, Thermally Conductive Electrically Insulating Low Thermal Expansion Adhesive Epoxy Adhesive, Thermo-Bond 110, 50gm kits(s), Amazon.com, Mar. 23, 2016, https://www.amazon.com/Thermally-Conductive-Electrically-Insulating-Thermo-Bond/dp/B01DCH8ROI.

* cited by examiner

INJECTABLE HEAT SINK

CROSS-REFERENCED TO RELATED APPLICATIONS

This application claims benefit of U.S. Provisional Application No. 63/084,805, filed on Sep. 29, 2020, the disclosure of which is hereby incorporated by reference in its entirety for all purposes.

BACKGROUND OF THE INVENTION

1. Field of the Invention

The present invention relates to a heat sink, and, more particularly, to a heat sink for dissipating heat from a component in a motor vehicle.

2. Description of the Related Art

Heat sinks are known to physically engage and carry heat away from electronic components that otherwise may be damaged by the heat. The heat sink typically is made of aluminum and has a base with a surface that contacts the electronic component. The heat sink also typically has a series of fins extending from the base in a direction away from the electronic component. The fins provide a large surface area within a limited three-dimensional space to thereby increase the rate of convection of heat from the heat sink to the air.

Traditionally, heat sinks are either cast or extruded and require expensive tooling to produce.

SUMMARY OF THE INVENTION

The invention may provide a method for redistributing heat from a heat source utilizing an expanding foam-based injectable heat sink. The injectable heat sink may be injected into a cavity in an assembly to remove heat from the assembly without a need for specific heat sink tooling.

The injection may be performed using a system including a customized injection nozzle or customized plugs to ensure that the foam is injected and kept where it will be most useful for heat dissipation purposes.

The heat sink may be formed of a compound based on an electrically insulating and thermally conductive two-part epoxy and a foaming agent. The epoxy components may be fully mixed with the foaming agents.

One example of a foaming agent is the combination of isocyanate and water. This combination generates carbon dioxide which, in turn, is trapped within the curing epoxy. Although the created carbon dioxide pockets have a lower thermal conductivity than the displaced air, the combination of the high thermal conductivity of the epoxy and the carbon dioxide should, even at a ratio of 5:1 carbon dioxide to epoxy by final volume, yield an order of magnitude improvement in thermal conductivity over the displaced air.

Plugs may be used to contain the foam within the cavity. The plugs may be shaped such that they allow some of the foam to escape from the cavity in a controlled manner. The escaped foam may then be exposed to an air flow which may improve the thermal dissipation properties of the injectable heat sink. Even if air flow exposure is not possible, the increased thermal mass may distribute the heat more evenly within the cavity and thereby protect the electrical components from overheating for a longer duration.

The invention comprises, in one form thereof, a heat sink arrangement including a housing associated with an electronic heat source. The housing has a cavity adjacent to the heat source. A thermally conductive, electrically insulating foam heat sink is disposed in the cavity and draws heat out of the heat source. The foam heat sink may be formed of a two-part epoxy.

The invention comprises, in another form thereof, a method of removing heat from an electronic heat source that is associated with a housing having a cavity. A fluid foam is blown into the cavity. After the liquid foam has cured into a solid or semi-solid foam inside the cavity, the electronic heat source is operated. The solid or semi-solid foam in the cavity is used to draw heat out of the electronic heat source.

The invention comprises, in yet another form thereof, a heat sink arrangement including an electronic assembly having a housing containing a high-power electronic component that produces heat during operation. The housing has a cavity. A first container contains a first epoxy part and a first blowing agent part. A second container contains a second epoxy part and a second blowing agent part. A nozzle blows a mixture of contents of the first container and contents of the second container into the cavity of the housing to thereby form a thermally conductive, electrically insulating foam heat sink in the cavity for drawing heat out of the electronic component.

An advantage of the present invention is that it may enable the implementation of a heat sink into a partially enclosed space without the need for dedicated heat sink tooling and heat sink fastening.

Another advantage of the present invention is it may reduce the investment costs associated with implementing a heat sink as well as enable the implementation of a heat sink late in a product development cycle if thermal problems are detected.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
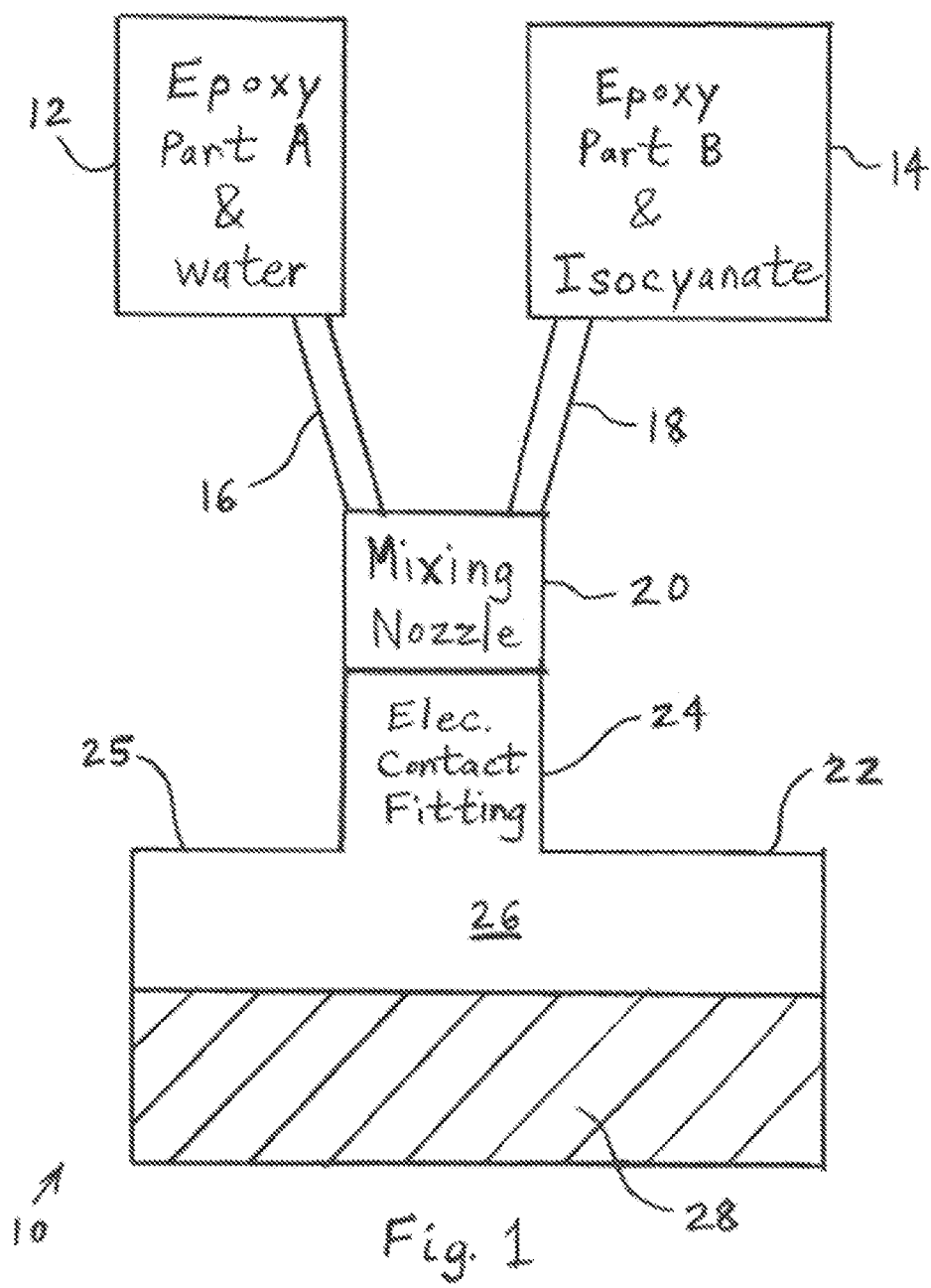
FIG. 1 is a schematic diagram of one embodiment of a heat sink arrangement of the present invention.

FIG. 1 illustrates one embodiment of a heat sink arrangement 10 of the present invention, including a two-part foam injection system with a customized injection nozzle. More particularly, arrangement 10 includes a first container tank 12, a second container tank 14, a first hose 16, a second hose 18, a mixing injection nozzle 20, and an electronic assembly 22. First tank 12 contains a mixture of water and epoxy part A, which is one part of a two-part, thermally conductive, electrically insulating epoxy. Second tank 14 contains a mixture of isocyanate and epoxy part B, which is the other part of the two-part epoxy. Isocyanate has the formula R—N=C=O.

Figure 2:
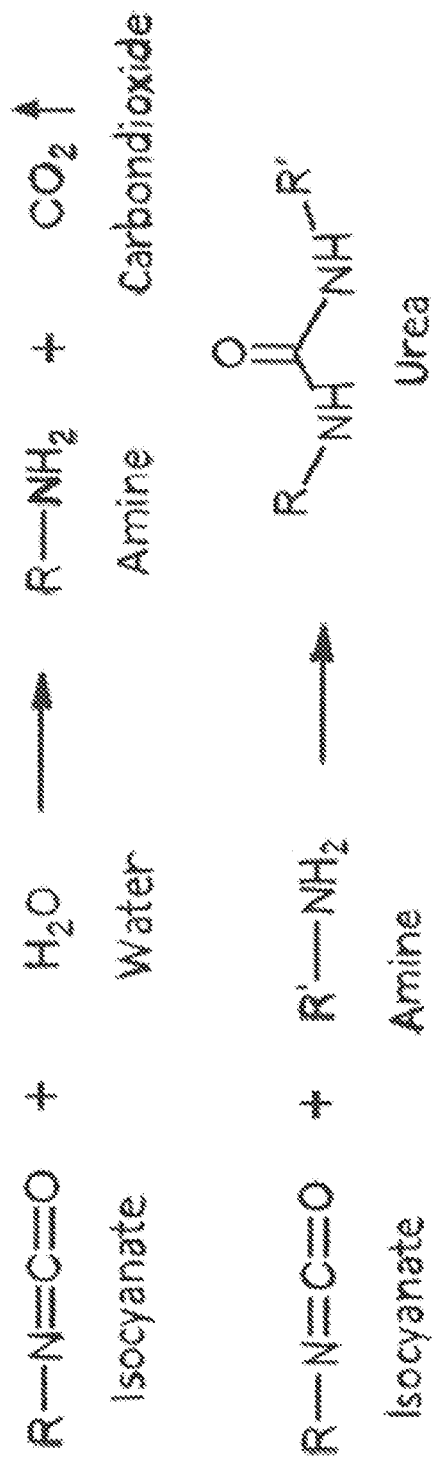
FIG. 2 is a diagram of the blowing agent chemistry of one embodiment of a heat sink arrangement of the present invention.

First hose 16 carries the mixture from first tank 12 to nozzle 20, and second hose 18 carries the mixture from second tank 14 to nozzle 20. The water from first hose 16 and the isocyanate from second hose 18 mix together in nozzle 20 to form a carbon dioxide blowing agent. The formation of carbon dioxide may create high pressure in nozzle 20 for blowing the contents of nozzle 20 out of nozzle 20. FIG. 2 describes in molecular terms the chemical formulation of the blowing agent in nozzle 20.

Electronic assembly 22 includes an electrical contact fitting 24, a housing 25 having a cavity 26, and a heat source 28. Heat source 28 is schematically depicted in FIG. 1 as a shaded area, but may include any electronic source of heat, such as transistors, power amplifiers, integrated circuits, etc.

During use, nozzle 20 is inserted into a housing of electronic assembly 22. More specifically, nozzle 20 is inserted into electrical contact fitting 24 in the embodiment of FIG. 1. Nozzle 20 can then be opened to thereby commence a flow of fluid foam from a mixture of the contents of tanks 12 and 14 into the open space of cavity 26. The foam may completely fill cavity 26 and cure/solidify and expand into a solid or semi-solid heat sink foam within cavity 26. After the foam has expanded in cavity 26, nozzle 20 may be removed from electrical contact fitting 24.

During the operation of electronic assembly 22, the foam, thermally conductive, electrically insulating heat sink within cavity 26 may absorb or draw heat from heat source 28, and thereby cool heat source 28.

Figure 3:
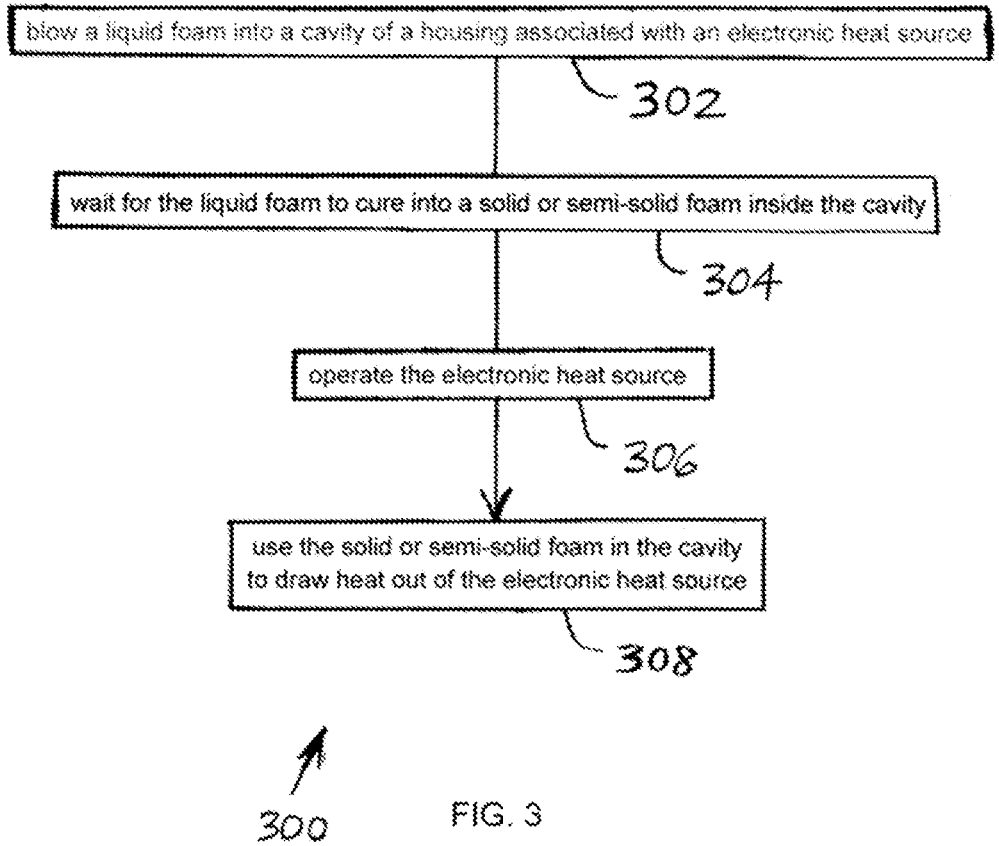
FIG. 3 is a flow chart of a method of the present invention for removing heat from an electronic heat source that is associated with a housing having a cavity.

FIG. 3 is a flow chart of a method 300 of the present invention for removing heat from an electronic heat source that is associated with a housing having a cavity. In a first step 302, a liquid foam is blown into the cavity. For example, nozzle 20 can blow a liquid foam into cavity 26.

In a next step 304, waiting takes place for the liquid foam to cure into a solid or semi-solid foam inside the cavity. For example, it is possible that no positive actions occur while the foam cures/solidifies into a solid or semi-solid foam that functions as a heat sink within cavity 26.

Next, in step 306, the electronic heat source is operated. For example, voltage may be applied to the electronics of heat source 28, thereby causing the electronics to operate and create heat.

In a final step 308, the solid or semi-solid foam in the cavity is used to draw heat out of the electronic heat source. For example, the foam heat sink within cavity 26 may absorb or draw heat from heat source 28.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A heat sink arrangement, comprising:
   an electronic assembly including:
      a high-power electronic component that produces heat during operation; and
      a housing containing the electronic component, the housing having a cavity;
   a first container containing a first epoxy part and a first blowing agent part;
   a second container containing a second epoxy part and a second blowing agent part; and
   a nozzle configured to blow a mixture of contents of the first container and contents of the second container into the cavity of the housing to thereby form a foam heat sink in the cavity for drawing heat out of the electronic component, wherein the first blowing agent part and the second blowing agent part form a blowing agent in the form of high-pressure gaseous carbon dioxide.

2. The heat sink arrangement of claim 1 wherein the electronic component comprises a transistor, a power amplifier, and/or an integrated circuit.

3. The heat sink arrangement of claim 1 wherein the heat sink is thermally conductive and electrically insulating, and substantially fills the cavity.

4. The heat sink arrangement of claim 1 wherein gaseous carbon dioxide is trapped within the foam heat sink.

5. The heat sink arrangement of claim 4 wherein the heat sink is expanded within the cavity by the gaseous carbon dioxide.

6. The heat sink arrangement of claim 1 wherein the heat sink cures into a solid or semi-solid foam after the mixture of contents is blown into the into the cavity of the housing as a liquid foam.

7. A heat sink arrangement, comprising:
   an electronic assembly including:
      a high-power electronic component that produces heat during operation;
      a housing containing the electronic component, the housing having a cavity; and
      an electrical contact fitting connected to the housing;
   a first container containing a first epoxy part and a first blowing agent part;
   a second container containing a second epoxy part and a second blowing agent part; and
   a nozzle configured to blow a mixture of contents of the first container and contents of the second container through the electrical contact fitting into the cavity of the housing to thereby form a foam heat sink in the cavity for drawing heat out of the electronic component.

8. The heat sink arrangement of claim 7 wherein the electronic component comprises a transistor, a power amplifier, and/or an integrated circuit.

9. The heat sink arrangement of claim 7 wherein the heat sink is thermally conductive and electrically insulating, and substantially fills the cavity.

10. The heat sink arrangement of claim 7 wherein gaseous carbon dioxide is trapped within the foam heat sink.

11. A heat sink arrangement, comprising:
    an electronic assembly including:
       a high-power electronic component that produces heat during operation; and
       a housing containing the electronic component, the housing having a cavity; and
    a nozzle configured to blow a mixture of contents of a first container and contents of a second container into the cavity of the housing to thereby form a foam heat sink in the cavity for drawing heat out of the electronic component, wherein the first container contains a first epoxy part and a first blowing agent part, and the second container contains a second epoxy part and a second blowing agent part, wherein the first blowing agent part and the second blowing agent part form a blowing agent.

12. The heat sink arrangement of claim 11 wherein the heat sink is thermally conductive and electrically insulating, and substantially fills the cavity.

13. The heat sink arrangement of claim 11 wherein the electronic component comprises a transistor, a power amplifier, and/or an integrated circuit.

14. The heat sink arrangement of claim 11 wherein gaseous carbon dioxide is trapped within the foam heat sink.

15. The heat sink arrangement of claim 14 wherein the heat sink is expanded within the cavity by the gaseous carbon dioxide.

16. The heat sink arrangement of claim 11 wherein the heat sink cures into a solid or semi-solid foam after the mixture of contents is blown into the into the cavity of the housing as a liquid foam.

17. A heat sink arrangement, comprising:
an electronic assembly including:
 a high-power electronic component that produces heat during operation;
 a housing containing the electronic component, the housing having a cavity; and
 an electrical contact fitting connected to the housing; and
a nozzle configured to blow a mixture of contents of a first container and contents of a second container into the cavity of the housing through the electrical contact fitting to thereby form a foam heat sink in the cavity for drawing heat out of the electronic component.

18. A heat sink arrangement, comprising:
an electronic assembly including:
 an electronic component that produces heat during operation; and
 a housing containing the electronic component, the housing having a cavity; and
 an electrical contact fitting connected to the housing; and
a nozzle configured to blow a mixture of a two-part epoxy and a blowing agent into the cavity of the housing through the electrical contact fitting to thereby form a foam heat sink in the cavity for drawing heat out of the electronic component.

19. The heat sink arrangement of claim 18 wherein the heat sink is thermally conductive and electrically insulating, and substantially fills the cavity.

20. The heat sink arrangement of claim 18, wherein the heat sink cures into a solid or semi-solid foam after the mixture of the two-part epoxy and the blowing agent is blown into the into the cavity of the housing as a liquid foam.

* * * * *